(12) United States Patent
Tsou et al.

(10) Patent No.: US 10,586,763 B2
(45) Date of Patent: Mar. 10, 2020

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Hsien-Ju Tsou, Taipei (TW); Chih-Wei Wu, Zhuangwei Township (TW); Jing-Cheng Lin, Hsinchu (TW); Pu Wang, Hsinchu (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/966,558

(22) Filed: Apr. 30, 2018

(65) Prior Publication Data
US 2019/0148288 A1 May 16, 2019

Related U.S. Application Data

(60) Provisional application No. 62/586,530, filed on Nov. 15, 2017.

(51) Int. Cl.
*H01L 23/522* (2006.01)
*H01L 23/538* (2006.01)
(Continued)

(52) U.S. Cl.
CPC .... *H01L 23/5226* (2013.01); *H01L 21/76837* (2013.01); *H01L 21/76871* (2013.01); *H01L 23/5384* (2013.01); *H01L 23/5389* (2013.01); *H01L 24/19* (2013.01); *H01L 24/96* (2013.01); *H01L 24/97* (2013.01); *H01L 25/105* (2013.01); *H01L 25/50* (2013.01); *H01L 25/0657* (2013.01); *H01L 2224/12105* (2013.01); *H01L 2224/18* (2013.01); *H01L 2224/32145* (2013.01); *H01L 2224/32225* (2013.01); *H01L 2224/48227* (2013.01);
(Continued)

(58) Field of Classification Search
None
See application file for complete search history.

(56) References Cited

U.S. PATENT DOCUMENTS 6,387,793 B1 * 5/2002 Yap .................. H01L 24/11
257/E21.508
8,802,504 B1 8/2014 Hou et al.
(Continued)

FOREIGN PATENT DOCUMENTS

CN 105374693 A 3/2016
CN 105679718 A 6/2016
(Continued)

*Primary Examiner* — Nishath Yasmeen
(74) *Attorney, Agent, or Firm* — Slater Matsil, LLP (57) ABSTRACT

An integrated fan out package on package architecture is utilized along with de-wetting structures in order to reduce or eliminated delamination from through vias. In embodiments the de-wetting structures are titanium rings formed by applying a first seed layer and a second seed layer in order to help manufacture the vias. The first seed layer is then patterned into a ring structure which also exposes at least a portion of the first seed layer.

20 Claims, 9 Drawing Sheets

(51) Int. Cl.
*H01L 23/00* (2006.01)
*H01L 21/768* (2006.01)
*H01L 25/00* (2006.01)
*H01L 25/10* (2006.01)
*H01L 25/065* (2006.01)

(52) U.S. Cl.
CPC ........... *H01L 2224/73265* (2013.01); *H01L 2224/73267* (2013.01); *H01L 2224/92244* (2013.01); *H01L 2224/94* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2225/1082* (2013.01); *H01L 2924/15311* (2013.01); *H01L 2924/18162* (2013.01)

(56) References Cited

U.S. PATENT DOCUMENTS

| | | | |
|---|---|---|---|
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,496,189 B2 | 3/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,543,170 B2 | 1/2017 | Yu et al. | |
| 9,583,420 B2 | 2/2017 | Lin et al. | |
| 9,595,510 B1 | 3/2017 | Hung et al. | |
| 9,842,826 B2 | 12/2017 | Lin et al. | |
| 9,899,248 B2 | 2/2018 | Yu et al. | |
| 10,068,844 B2 | 9/2018 | Chiu et al. | |
| 2011/0147929 A1* | 6/2011 | Roy | H01L 21/4857 257/738 |
| 2015/0069623 A1* | 3/2015 | Tsai | H01L 21/563 257/774 |

FOREIGN PATENT DOCUMENTS

| | | |
|---|---|---|
| CN | 106356340 A | 1/2017 |
| TW | 201639112 A | 11/2016 |
| TW | 201714228 A | 4/2017 |
| TW | 201724357 A | 7/2017 |

* cited by examiner

SEMICONDUCTOR DEVICE AND METHOD OF MANUFACTURE

PRIORITY CLAIM AND CROSS-REFERENCE

This application claims the benefits of U.S. Provisional Application Ser. No. 62/586,530, entitled "Semiconductor Device and Method of Manufacture," filed on Nov. 15, 2017, which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
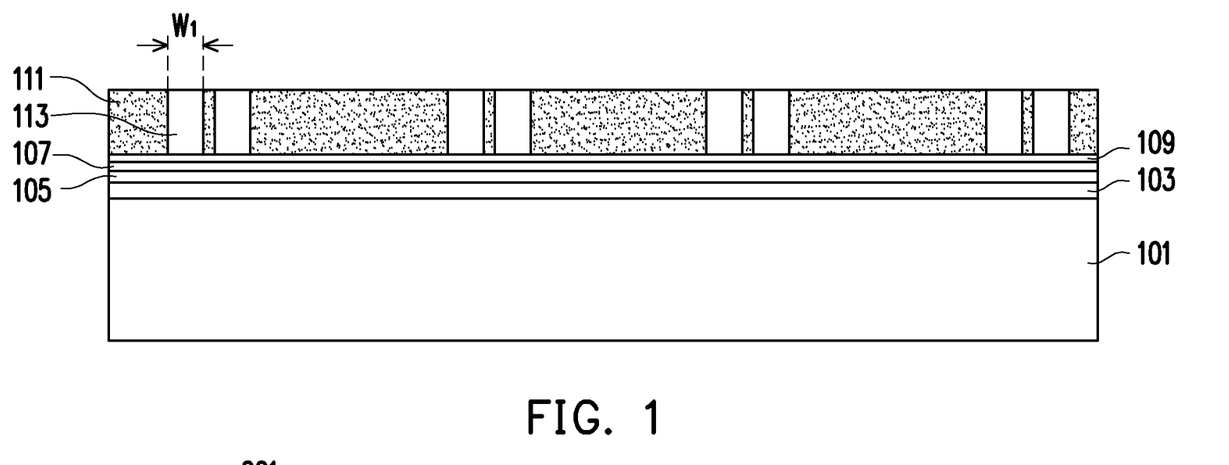
FIG. 1 illustrates a formation of through vias in accordance with some embodiments.

With reference now to FIG. 1, there is shown a first carrier substrate 101 with an adhesive layer 103, a polymer layer 105, a first seed layer 107 (or first lining layer) and a second seed layer 109 (or second lining layer) over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, a light to heat conversion (LTHC) material, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, may alternatively be utilized. The polymer layer 105 may be placed using, e.g., a spin-coating process to a thickness of between about 0.5 μm and about 10 μm, such as about 5 μm, although any suitable method and thickness may alternatively be used.

The first seed layer 107 is formed over the polymer layer 105. In an embodiment the first seed layer 107 is utilized as a de-wetting structure that can be used to help reduce or eliminate delamination between a subsequently formed fourth external connection 903 such as solder. As such, the first seed layer 107 may be formed of a material that increases the adhesion of the layers without causing other undesired seed effects or removal issues, such as titanium, although any other suitable material or combination of materials, may also be utilized. The first seed layer 107 may be formed through a process such as physical vapor deposition, evaporation, chemical vapor deposition, atomic layer deposition, or the like, and may be formed to a thickness of between about 50 Å and about 300 Å, such as about 200 Å. However, any suitable method or thickness may be utilized.

The second seed layer 109 is formed over the first seed layer 107. In an embodiment the second seed layer 109 is a thin layer of a conductive material that aids in the formation of a thicker layer during subsequent processing steps. The second seed layer 109 may comprise a layer of titanium about 1,000 Å thick followed by a layer of copper about 5,000 Å thick. The second seed layer 109 may be created using processes such as physical vapor deposition, evaporation, or PECVD processes, or metal foil laminating process, or the like, depending upon the desired materials. The second seed layer 109 may be formed to have a thickness of between about 0.3 μm and about 1 μm, such as about 0.5 μm.

FIG. 1 also illustrates a placement and patterning of a photoresist 111 over the second seed layer 109. In an embodiment the photoresist 111 may be placed on the second seed layer 109 using, e.g., a spin coating technique to a height of between about 50 μm and about 250 μm, such as about 120 μm. Once in place, the photoresist 111 may then be patterned by exposing the photoresist 111 to a patterned energy source (e.g., a patterned light source) so as to induce a chemical reaction, thereby inducing a physical change in those portions of the photoresist 111 exposed to the patterned light source. A developer is then applied to the exposed photoresist 111 to take advantage of the physical changes and selectively remove either the exposed portion of the photoresist 111 or the unexposed portion of the photoresist 111, depending upon the desired pattern.

In an embodiment the pattern formed into the photoresist 111 is a pattern for vias 113. The vias 113 are formed in such a placement as to be located on different sides of subsequently attached devices such as the first semiconductor device 201 and the second semiconductor device 301. However, any suitable arrangement for the pattern of vias 113, such as by being located such that the first semiconductor device 201 and the second semiconductor device 301 are placed on opposing sides of the vias 113, may alternatively be utilized.

In an embodiment the vias 113 are formed within the photoresist 111. In an embodiment the vias 113 comprise one or more conductive materials, such as copper, tungsten, other conductive metals, or the like, and may be formed, for example, by electroplating, electroless plating, or the like. In an embodiment, an electroplating process is used wherein the second seed layer 109 and the photoresist 111 are submerged or immersed in an electroplating solution. The second seed layer 109 surface is electrically connected to the negative side of an external DC power supply such that the second seed layer 109 functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer 109, acquires the dissolved atoms, thereby plating the exposed conductive areas of the second seed layer 109 within the opening of the photoresist 111.

Once the vias 113 have been formed using the photoresist 111 and the second seed layer 109, the photoresist 111 may be removed using a suitable removal process (not illustrated in FIG. 1 but seen in FIG. 3 below). In an embodiment, a plasma ashing process may be used to remove the photoresist 111, whereby the temperature of the photoresist 111 may be increased until the photoresist 111 experiences a thermal decomposition and may be removed. However, any other suitable process, such as a wet strip, may alternatively be utilized. The removal of the photoresist 111 may expose the underlying portions of the second seed layer 109.

Once exposed a removal of the exposed portions of the second seed layer 109 and the first seed layer 107 may be performed (not illustrated in FIG. 1 but seen in FIG. 3 below). In an embodiment the exposed portions of the second seed layer 109 and the first seed layer 107 (e.g., those portions that are not covered by the vias 113) may be removed by, for example, one or more wet or dry etching processes. For example, in a dry etching process reactants may be directed towards the second seed layer 109 and the first seed layer 107 using the vias 113 as masks. In another embodiment, etchants may be sprayed or otherwise put into contact with the second seed layer 109 and the first seed layer 107 in order to remove the exposed portions of the second seed layer 109 and the first seed layer 107. After the exposed portion of the second seed layer 109 and the first seed layer 107 has been etched away, a portion of the polymer layer 105 is exposed between the vias 113.

In an embodiment the vias 113, the first seed layer 107, and the second seed layer 109 will all have the same first width $W_1$. For example, the vias 113, the first seed layer 107, and the second seed layer 109 may have the first width $W_1$ of about 200 μm. However, any suitable dimensions may be utilized.

Figure 2:
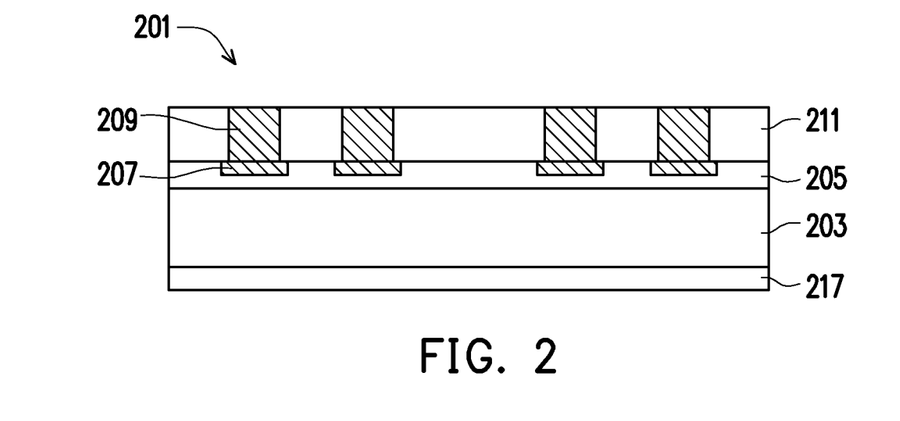
FIG. 2 illustrates a semiconductor die in accordance with some embodiments.

FIG. 2 illustrates a first semiconductor device 201 that will be attached to the polymer layer 105 within the vias 113 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional features of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 µm and about 5 µm, such as about 9.25 KÅ.

The first external connectors 209 may be formed to provide conductive regions for contact between the first contact pads 207 and, e.g., a redistribution layer (RDL) 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layer 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, solder, metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

A first die attach film 217 may be placed on an opposite side of the first substrate 203 in order to assist in the attachment of the first semiconductor device 201 to the polymer layer 105. In an embodiment the first die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
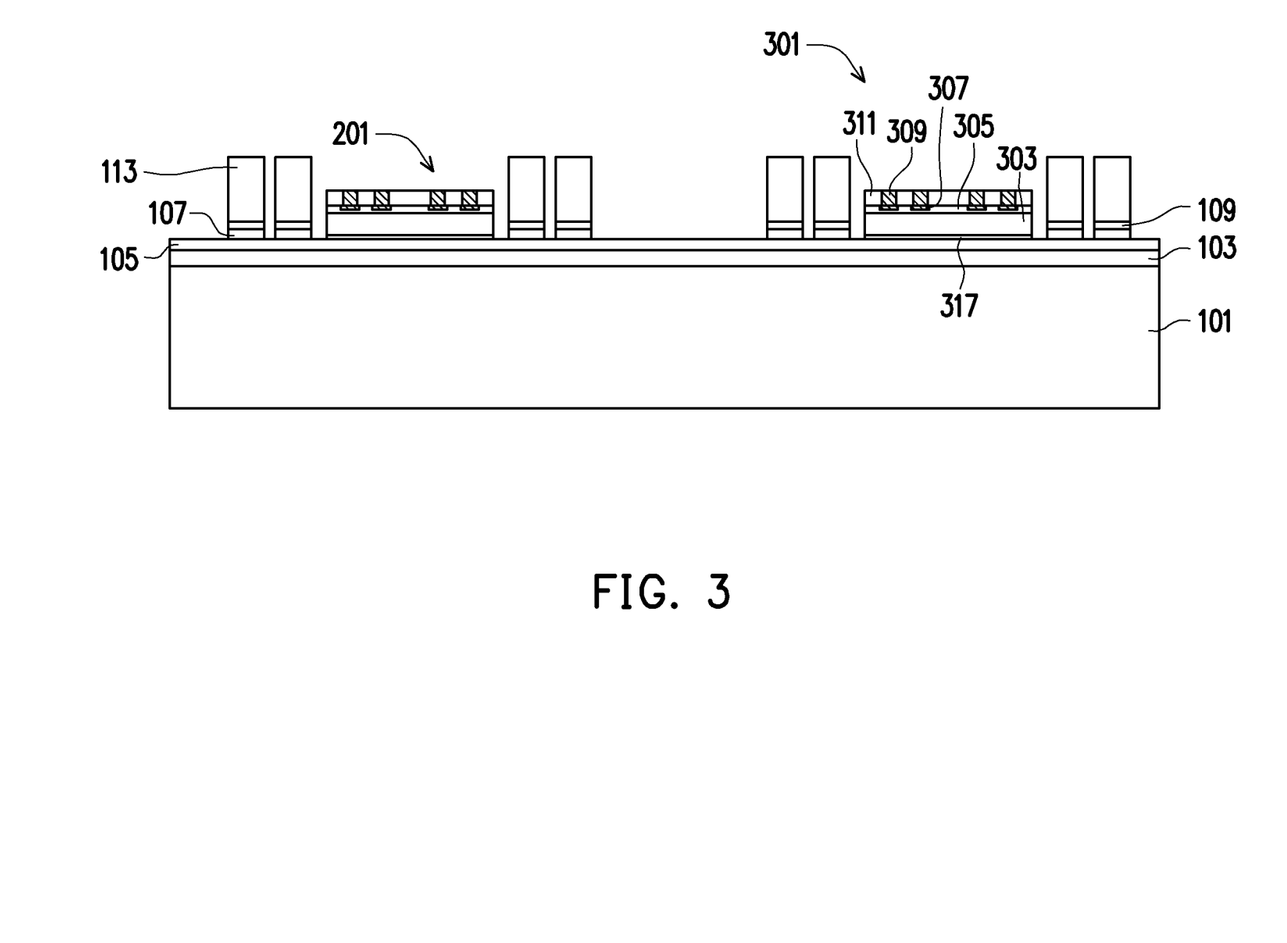
FIG. 3 illustrates a placement of the semiconductor die between the through vias in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, second external connectors 309, and a second die attach film 317. In an embodiment the second substrate 303, the second active devices, the second metallization layers 305, the second contact pads 307, the second passivation layer 311, the second external connectors 309, and the second die attach film 317 may be similar to the first substrate 203, the first active devices, the first metallization layers 205, the first contact pads 207, the first passivation layer 211, the first external connectors 209, and the first die attach film 217 as described above with respect to FIG. 2, although they may also be different.

In an embodiment the first semiconductor device 201 and the second semiconductor device 301 may be placed onto the polymer layer 105 between different ones of the vias 113. In an embodiment the first semiconductor device 201 and the second semiconductor device 301 may be placed using, e.g., a pick and place process. However, any other method of placing the first semiconductor device 201 and the second semiconductor device 301 onto the polymer layer 105 may also be utilized.

Figure 4:
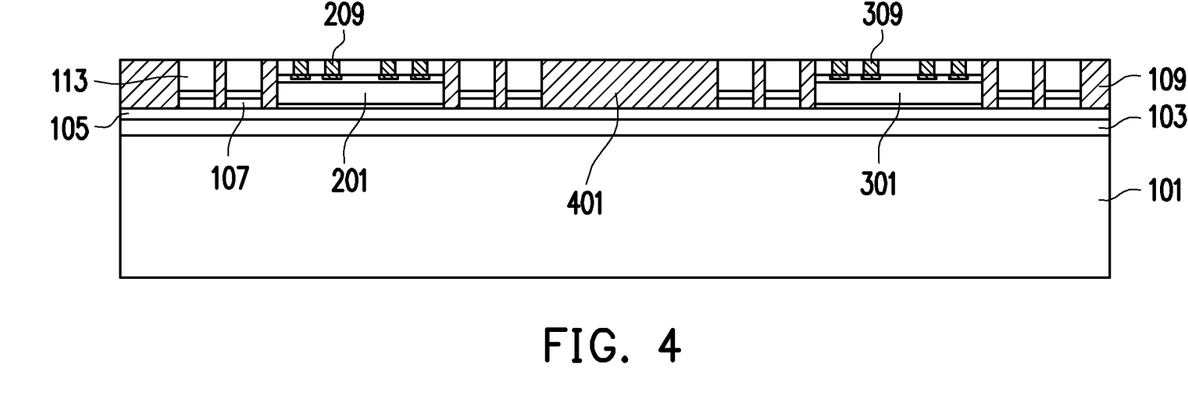
FIG. 4 illustrates an encapsulation of the reference via, the through vias, and the semiconductor die in accordance with some embodiments.

FIG. 4 illustrates an encapsulation of the vias 113, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 113, the first semiconductor device 201, and the second semiconductor device 301.

During the encapsulation process the top molding portion may be placed adjacent to the bottom molding portion, thereby enclosing the first carrier substrate 101, the vias 113, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 113, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3600 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 113, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 113, the first external connectors 209 (on the first semiconductor device 201), and the second external connectors 309 (on the second semiconductor device 301) have been exposed. As such, the first semiconductor device 201, the second semiconductor device 301, and the vias 113 may have a planar surface that is also planar with the encapsulant 401.

However, while the CMP process described above is presented as one illustrative embodiment, it is not intended to be limiting to the embodiments. Any other suitable removal process may be used to thin the encapsulant 401, the first semiconductor device 201, and the second semiconductor device 301 and expose the vias 113. For example, a series of chemical etches may be utilized. This process and any other suitable process may be utilized to thin the encapsulant 401, the first semiconductor device 201, and the second semiconductor device 301, and all such processes are fully intended to be included within the scope of the embodiments.

Figure 5:
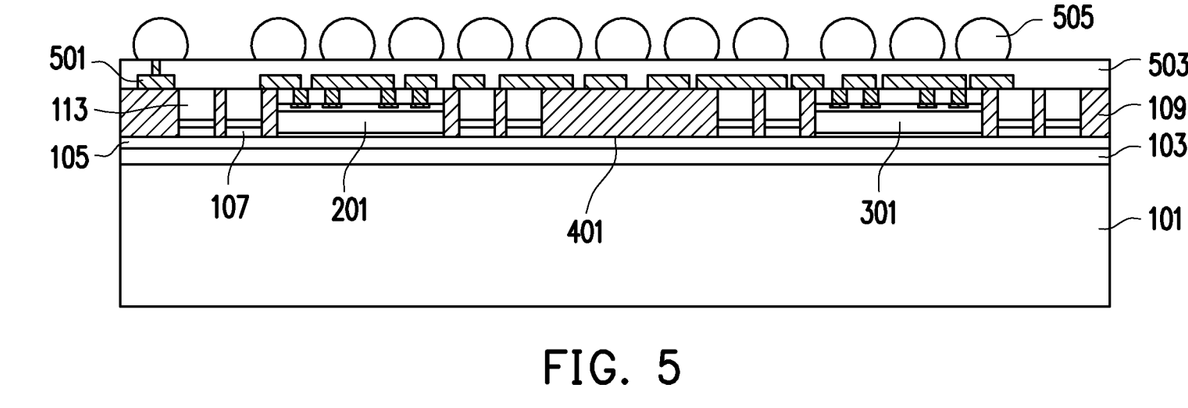
FIG. 5 illustrates a formation of a redistribution layer in accordance with some embodiments.

FIG. 5 illustrates a formation of the RDL 501 in order to interconnect the first semiconductor device 201, the second semiconductor device 301, the vias 113, and third external connectors 505. By using the RDL 501 to interconnect the first semiconductor device 201 and the second semiconductor device 301, the first semiconductor device 201 and the second semiconductor device 301 may have a pin count of greater than 1000.

In an embodiment the RDL 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the RDL 501 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the RDL 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5 also illustrates a formation of a third passivation layer 503 over the RDL 501 in order to provide protection and isolation for the RDL 501 and the other underlying structures. In an embodiment the third passivation layer 503 may be polybenzoxazole (PBO), although any suitable material, such as polyimide or a polyimide derivative, may be utilized. The third passivation layer 503 may be placed using, e.g., a spin-coating process to a thickness of between about 5 μm and about 25 μm, such as about 7 μm, although any suitable method and thickness may alternatively be used.

Also, while only a single RDL 501 is illustrated in FIG. 5, this is intended for clarity and is not intended to limit the embodiments. Rather, any suitable number of conductive and passivation layers, such as three RDL 501 layers, may be formed by repeating the above described process to form the RDL 501. Any suitable number of layers may be utilized.

FIG. 5 further illustrates a formation of the third external connectors 505 to make electrical contact with the RDL 501. In an embodiment after the third passivation layer 503 has been formed, an opening may be made through the third passivation layer 503 by removing portions of the third passivation layer 503 to expose at least a portion of the underlying RDL 501. The opening allows for contact between the RDL 501 and the third external connectors 505. The opening may be formed using a suitable photolithographic mask and etching process, although any suitable process to expose portions of the RDL 501 may be used.

In an embodiment the third external connectors 505 may be placed on the RDL 501 through the third passivation layer 503 and may be a ball grid array (BGA) which comprises a eutectic material such as solder, although any suitable materials may alternatively be used. Optionally, an underbump metallization may be utilized between the third external connectors 505 and the RDL 501. In an embodiment in which the third external connectors 505 are solder bumps, the third external connectors 505 may be formed using a ball drop method, such as a direct ball drop process. Alternatively, the solder bumps may be formed by initially forming a layer of tin through any suitable method such as evaporation, electroplating, printing, solder transfer, and then performing a reflow in order to shape the material into the desired bump shape. Once the third external connectors 505 have been formed, a test may be performed to ensure that the structure is suitable for further processing.

Figure 6A:
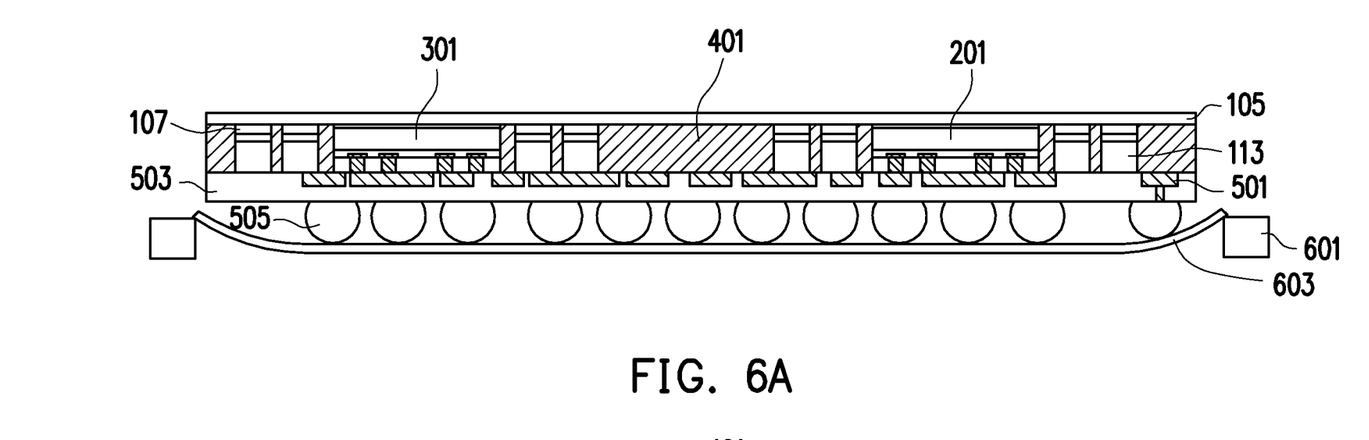
FIGS. 6A-6B illustrate a removal of a carrier in accordance with some embodiments.

FIG. 6A illustrates a debonding of the first carrier substrate 101 from the first semiconductor device 201 and the second semiconductor device 301. In an embodiment the third external connectors 505 and, hence, the structure including the first semiconductor device 201 and the second semiconductor device 301, may be attached to a ring structure 601. The ring structure 601 may be a metal ring intended to provide support and stability for the structure during and after the debonding process. In an embodiment the third external connectors 505, the first semiconductor device 201, and the second semiconductor device 301 are attached to the ring structure using, e.g., a ultraviolet tape 603, although any other suitable adhesive or attachment may alternatively be used.

Once the third external connectors 505 and, hence, the structure including the first semiconductor device 201 and the second semiconductor device 301 are attached to the ring structure 601, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 505, the first semiconductor device 201, and the second semiconductor device 301.

Figure 6B:
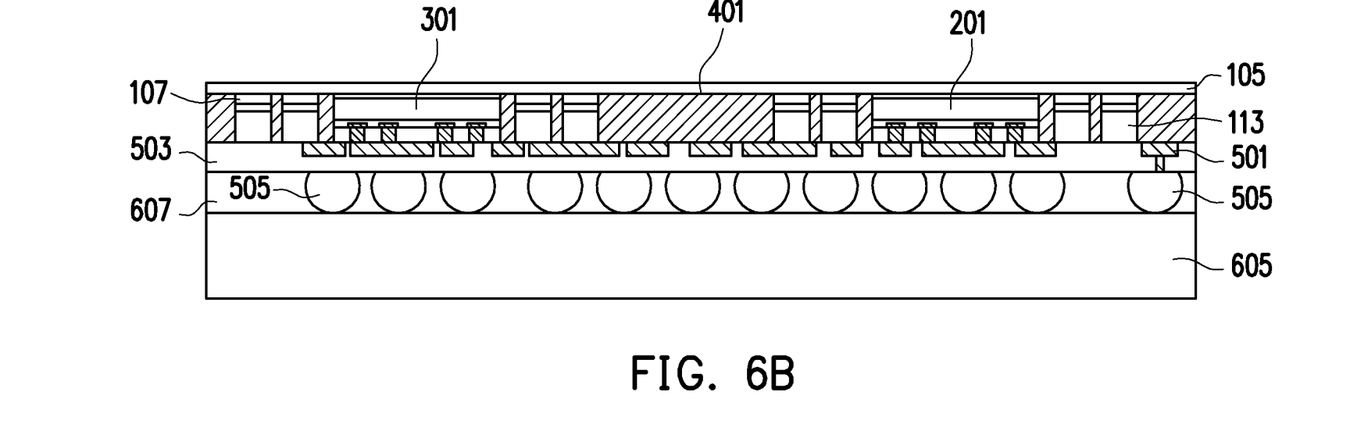

FIG. 6B illustrates another embodiment for debonding the first carrier substrate 101 from the first semiconductor device 201 and the second semiconductor device 301. In this embodiment the third external connectors 505 may be attached to a second carrier substrate 605 using, e.g., a first glue 607. In an embodiment the second carrier substrate 605 is similar to the first carrier substrate 101, although it may also be different. Once attached, the adhesive layer 103 may be irradiated and the adhesive layer 103 and the first carrier substrate 101 may be physically removed.

Figure 7:
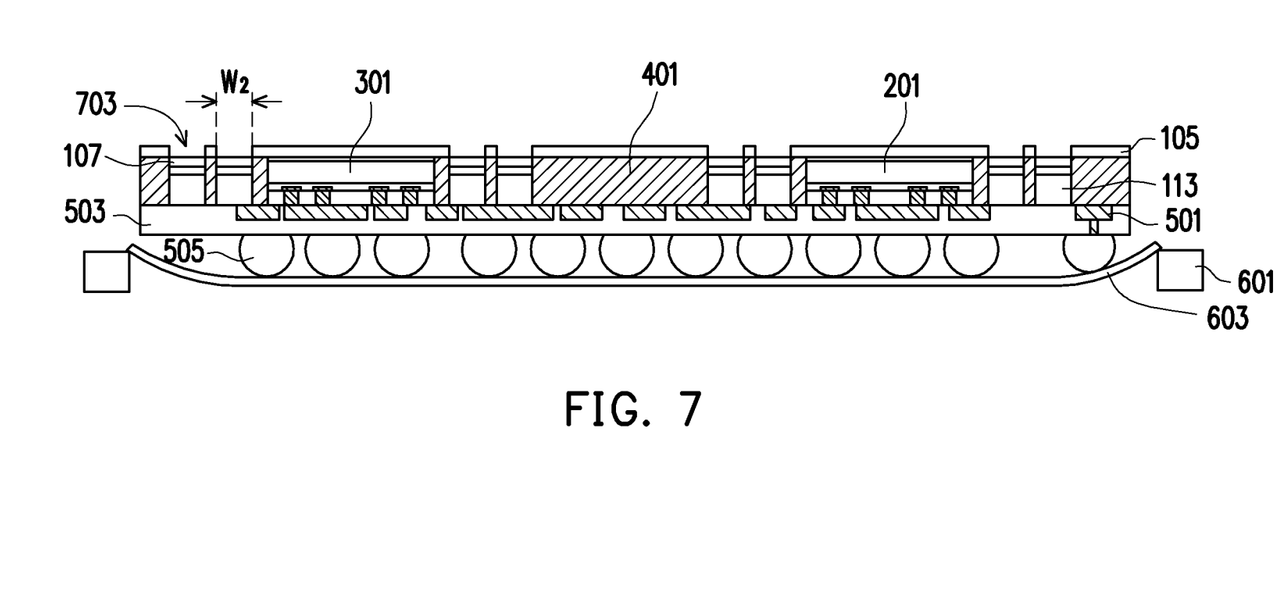
FIG. 7 illustrates a patterning of a polymer layer in accordance with some embodiments.

Returning to an embodiment in which the ring structure 601 is utilized, FIG. 7 illustrates a patterning of the polymer layer 105 in order to form first openings 703 and expose the vias 113 (along with each vias' 113 associated second seed layer 109). In an embodiment the polymer layer 105 may be patterned using, e.g., a laser drilling method, by which a laser is directed towards those portions of the polymer layer 105 which are desired to be removed in order to expose the underlying first seed layer 107. During the laser drilling process the drill energy may be in a range from 0.1 mJ to about 60 mJ, and a drill angle of about 0 degree (perpendicular to the polymer layer 105) to about 85 degrees to normal of the polymer layer 105.

In an embodiment the patterning may be formed to form the first openings 703 over the vias 113 to have a second width $W_2$ that is less than the first width $W_1$ of the vias 113. For example, in an embodiment in which the first width $W_1$ is about 200 µm, the first openings 703 may be formed to have the second width $W_2$ of less than about 200 µm, such as about 150 µm. However, any suitable dimensions may be utilized.

In another embodiment, the polymer layer 105 may be patterned by initially applying a photoresist (not individually illustrated in FIG. 7) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 8A:
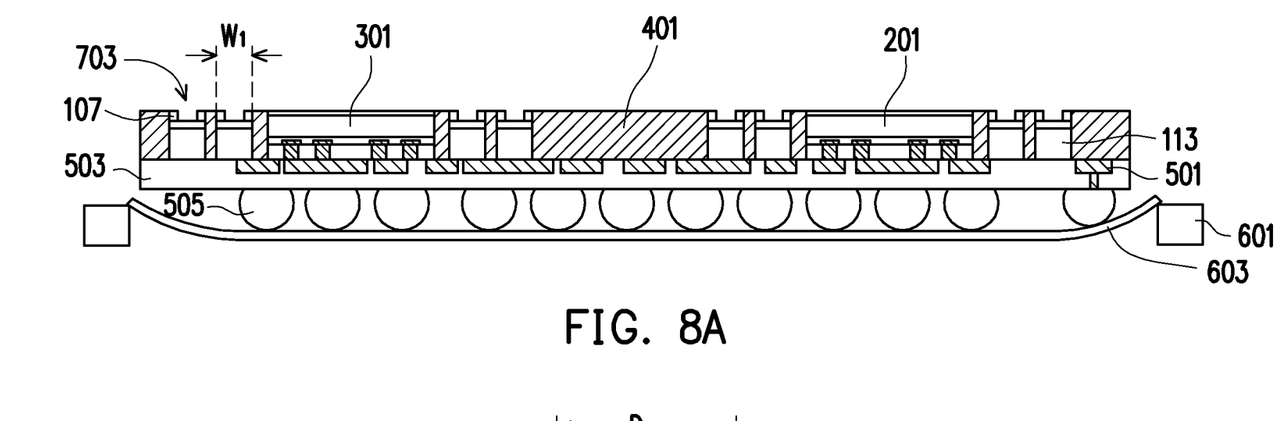
FIGS. 8A-8B illustrate a patterning of a first seed layer in accordance with some embodiments.
Figure 8B:
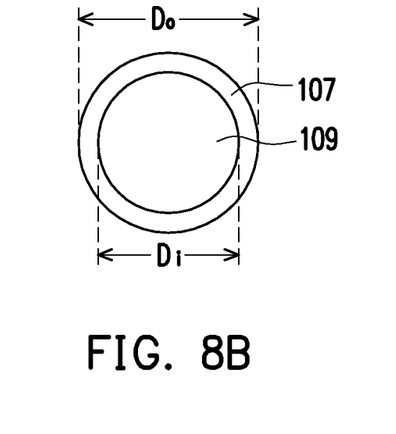

FIGS. 8A-8B illustrate a patterning of the first seed layer 107 through the patterned polymer layer 105 in order to expose the underlying second seed layer 109 along with a removal of the remainder of the polymer layer 105, with FIG. 8B illustrating a top down view of a single combination of the first seed layer 107 and the second seed layer 109. In an embodiment the patterning of the first seed layer 107 and the removal of the polymer layer 105 may be performed using a two-step post laser drill cleaning (PLDC) process, in which the first step is utilized to pattern the first seed layer 107.

For example, in an embodiment the first step of the PLDC process may include a first etching process such as an anisotropic etching process such as a dry etch process with plasma. For example, in one embodiment the first etching process utilizes etchants selective to the first seed layer 107 and directs the etchants towards the exposed portions of the first seed layer 107 (masked by the patterned polymer layer 105). As such, the pattern of the first openings 703 may be transferred into the first seed layer 107 and expose the second seed layer 109.

In particular, because the first openings 703 have already been formed within the polymer layer 105 prior to the removal of the polymer layer 105 (discussed further below), a portion of the first seed layer 107 is exposed during the first etching process. As such, the first etching process will remove the exposed portions of the first seed layer 107, thereby transferring the pattern of the first openings 703 into the first seed layer 107 and exposing the underlying second seed layer 109.

Once the second seed layer 109 has been exposed, the second step of the PLDC may be used to remove a remainder of the polymer layer 105. For example, the second step may utilize a second etching process such as an anisotropic etching process (a dry etch process with plasma) with etchants selective to the material of the polymer layer 105. With etchants selective to the material of the polymer layer 105, the second etching process can remove the material of the polymer layer 105 with either no removal or a minimal removal of the materials of the first seed layer 107 and the second seed layer 109. However, any suitable removal process, such as a wet etching process, may be utilized to remove the polymer layer 105.

Looking at FIG. 8B, the first seed layer 107 can be patterned into a ring shape, with a central region removed. In an embodiment the ring shape can have an outer diameter $D_o$ of the first width $W_1$ of between about 30 µm and about 250 µm, such as about 200 µm, and an inner diameter $D_i$ of the second width $W_2$ of between about 10 µm and about 230 µm, such as about 150 µm. However, any suitable dimensions may be utilized.

Additionally, while the first seed layer 107 is illustrated as being patterned into a ring shape, this shape is intended to be illustrative and is not intended to be limiting. Rather, any suitable shape that provides for additional adhesion may be utilized. For example, the first seed layer 107 may be patterned into a rectangular shape, or any other suitable shape. All such shapes are fully intended to be included within the scope of the embodiments.

By opening the polymer layer 105 (using, e.g., a laser drill) to form the first openings 703, and following that with a PLDC (using, e.g., a multi-step plasma clean), the resultant structure has a de-wetting ring (e.g., titanium) around the opened second seed layer 109 (e.g., copper). Such a de-wetting ring acts as a de-wetting structure to help prevent delamination concerns between the underfill and solder (discussed further below) which could cause further delamination between the metal contacts and the vias 113 (through interposer vias (TIVs)) and without the additional need and costs for the polymer layer 105 to act as a stress buffer.

Optionally, after the polymer layer 105 has been removed, backside ball pads (not separately illustrate in FIG. 8A) may be placed in order to protect the now exposed second seed layer 109. In an embodiment the backside ball pads may comprise a conductive material such as solder on paste or an organic solderability preservative (OSP), although any suitable material may alternatively be utilized. In an embodiment the backside ball pads may be applied using a stencil, although any suitable method of application may alternatively be utilized, and then reflowed in order to form a bump shape.

Also optionally, a backside protection layer (also not illustrated in FIG. 8A) may be placed and patterned over the backside ball pads to seal the joint between the backside ball pads and the first seed layer 107 and the second seed layer 109 from intrusion by moisture. In an embodiment the backside protection layer may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer may be applied using a process such as screen printing, lamination, spin coating, or the like, to a thickness of between about 1 µm to about 100 µm.

Figure 9:
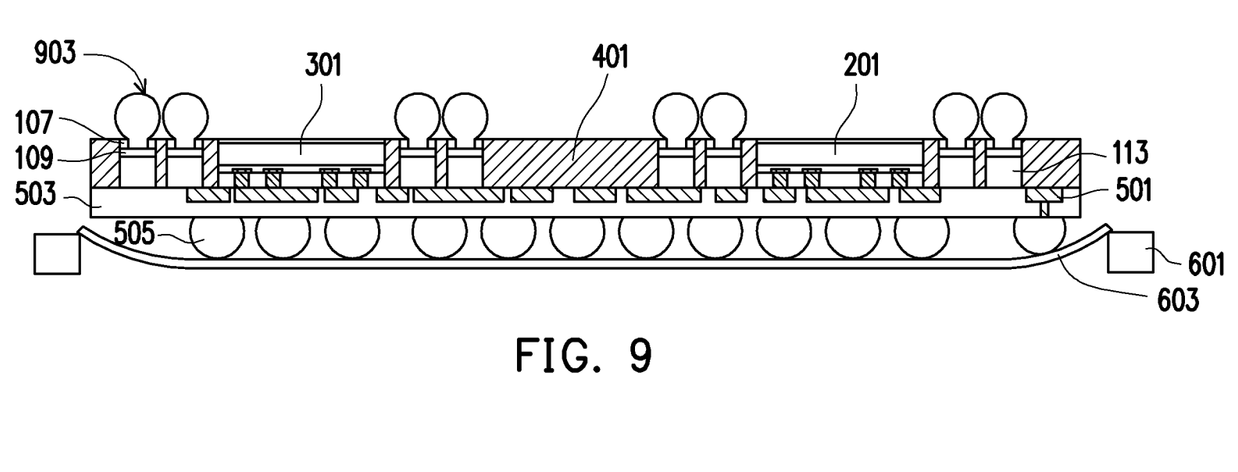
FIG. 9 illustrates a placement of external connections in accordance with some embodiments.

FIG. 9 illustrates a placement of fourth external connections 903 in physical contact with the first seed layer 107 and second seed layer 109 (in embodiments in which the backside ball pads are not present). In an embodiment the fourth external connections 903 may be formed to provide an external connection between the vias 113 and, e.g., a first package 1000 and a second package 1019 (not illustrated in FIG. 9 but illustrated and discussed below with respect to FIG. 10). The fourth external connections 903 may be contact bumps such as microbumps or controlled collapse chip connection (C4) bumps and may comprise a material such as tin, or other suitable materials, such as solder on past, silver, or copper. In an embodiment in which the fourth external connections 903 are tin solder bumps, the fourth external connections 903 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Figure 10:
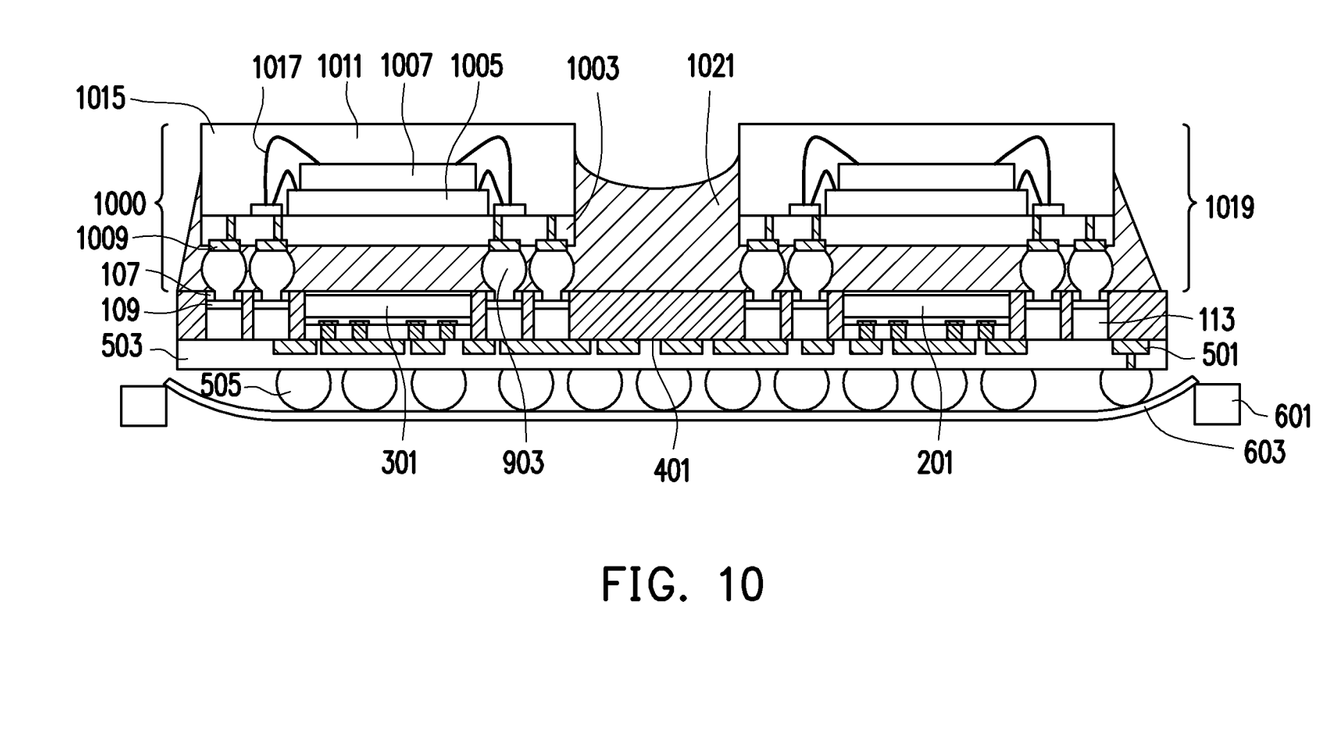
FIG. 10 illustrates a bonding of a first package and a second package in accordance with some embodiments.

FIG. 10 illustrates a bonding of the fourth external connections 903 to a first package 1000. In an embodiment the first package 1000 may comprise a third substrate 1003, a third semiconductor device 1005, a fourth semiconductor device 1007 (bonded to the third semiconductor device 1005), third contact pads 1009 (for electrical connection to the fourth external connections 903), and a second encapsulant 1011. In an embodiment the third substrate 1003 may be, e.g., a packaging substrate comprising internal interconnects (e.g., through substrate vias 1015) to connect the third semiconductor device 1005 and the fourth semiconductor device 1007 to the fourth external connections 903.

Alternatively, the third substrate 1003 may be an interposer used as an intermediate substrate to connect the third semiconductor device 1005 and the fourth semiconductor device 1007 to the fourth external connections 903. In this embodiment the third substrate 1003 may be, e.g., a silicon substrate, doped or undoped, or an active layer of a silicon-on-insulator (SOI) substrate. However, the third substrate 1003 may alternatively be a glass substrate, a ceramic substrate, a polymer substrate, or any other substrate that may provide a suitable protection and/or interconnection functionality. These and any other suitable materials may alternatively be used for the third substrate 1003.

The third semiconductor device 1005 may be a semiconductor device designed for an intended purpose such as being a logic die, a central processing unit (CPU) die, a memory die (e.g., a DRAM die), combinations of these, or the like. In an embodiment the third semiconductor device 1005 comprises integrated circuit devices, such as transistors, capacitors, inductors, resistors, first metallization layers (not shown), and the like, therein, as desired for a particular functionality. In an embodiment the third semiconductor device 1005 is designed and manufactured to work in conjunction with or concurrently with the first semiconductor device 201.

The fourth semiconductor device 1007 may be similar to the third semiconductor device 1005. For example, the fourth semiconductor device 1007 may be a semiconductor device designed for an intended purpose (e.g., a DRAM die) and comprising integrated circuit devices for a desired functionality. In an embodiment the fourth semiconductor device 1007 is designed to work in conjunction with or concurrently with the first semiconductor device 201 and/or the third semiconductor device 1005.

The fourth semiconductor device 1007 may be bonded to the third semiconductor device 1005. In an embodiment the fourth semiconductor device 1007 is only physically bonded with the third semiconductor device 1005, such as by using an adhesive. In this embodiment the fourth semiconductor device 1007 and the third semiconductor device 1005 may be electrically connected to the third substrate 1003 using, e.g., wire bonds 1017, although any suitable electrical bonding may be utilized.

Alternatively, the fourth semiconductor device 1007 may be bonded to the third semiconductor device 1005 both physically and electrically. In this embodiment the fourth semiconductor device 1007 may comprise fourth external connections (not separately illustrated in FIG. 10) that connect with fifth external connection (also not separately illustrated in FIG. 10) on the third semiconductor device 1005 in order to interconnect the fourth semiconductor device 1007 with the third semiconductor device 1005.

The third contact pads 1009 may be formed on the third substrate 1003 to form electrical connections between the third semiconductor device 1005 and, e.g., the fourth external connections 903. In an embodiment the third contact pads 1009 may be formed over and in electrical contact with electrical routing (such as through substrate vias 1015) within the third substrate 1003. The third contact pads 1009 may comprise aluminum, but other materials, such as copper, may alternatively be used. The third contact pads 1009 may be formed using a deposition process, such as sputtering, to form a layer of material (not shown) and portions of the layer of material may then be removed through a suitable process (such as photolithographic masking and etching) to form the third contact pads 1009. However, any other suitable process may be utilized to form the third contact pads 1009. The third contact pads 1009 may be formed to have a thickness of between about 0.5 μm and about 4 μm, such as about 1.45 μm.

The second encapsulant 1011 may be used to encapsulate and protect the third semiconductor device 1005, the fourth semiconductor device 1007, and the third substrate 1003. In an embodiment the second encapsulant 1011 may be a molding compound and may be placed using a molding device (not illustrated in FIG. 10). For example, the third substrate 1003, the third semiconductor device 1005, and the fourth semiconductor device 1007 may be placed within a cavity of the molding device, and the cavity may be hermetically sealed. The second encapsulant 1011 may be placed within the cavity either before the cavity is hermetically sealed or else may be injected into the cavity through an injection port. In an embodiment the second encapsulant 1011 may be a molding compound resin such as polyimide, PPS, PEEK, PES, a heat resistant crystal resin, combinations of these, or the like.

Once the second encapsulant 1011 has been placed into the cavity such that the second encapsulant 1011 encapsulates the region around the third substrate 1003, the third semiconductor device 1005, and the fourth semiconductor device 1007, the second encapsulant 1011 may be cured in order to harden the second encapsulant 1011 for optimum protection. While the exact curing process is dependent at least in part on the particular material chosen for the second encapsulant 1011, in an embodiment in which molding compound is chosen as the second encapsulant 1011, the curing could occur through a process such as heating the second encapsulant 1011 to between about 100° C. and about 130° C., such as about 125° C. for about 60 sec to about 3000 sec, such as about 600 sec. Additionally, initiators and/or catalysts may be included within the second encapsulant 1011 to better control the curing process.

However, as one having ordinary skill in the art will recognize, the curing process described above is merely an exemplary process and is not meant to limit the current embodiments. Other curing processes, such as irradiation or even allowing the second encapsulant 1011 to harden at ambient temperature, may be used. Any suitable curing process may be used, and all such processes are fully intended to be included within the scope of the embodiments discussed herein.

Once the fourth external connections 903 have been formed, the fourth external connections 903 are aligned with and placed into physical contact with the third contact pads 1009, and a bonding is performed. For example, in an embodiment in which the fourth external connections 903 are solder bumps, the bonding process may comprise a reflow process whereby the temperature of the fourth external connections 903 is raised to a point where the fourth external connections 903 will liquefy and flow, thereby bonding the first package 1000 to the fourth external connections 903 once the fourth external connections 903 resolidifies.

By placing the first package 1000 (which may be, e.g., a DRAM package) over the second semiconductor device 301, the first package 1000 is placed over a first receiving region 1002 designed to receive the first package 1000. In an embodiment the first receiving region 1002 has a size and shape determined by the desired size of the first package 1000 which is placed onto the first receiving region 1002.

FIG. 10 additionally illustrates the bonding of a second package 1019 to the fourth external connections 903. In an embodiment the second package 1019 may be similar to the first package 1000, and may be bonded to the fourth external connections 903 utilizing similar processes. However, the second package 1019 may also be different from the first package 1000.

FIG. 10 also illustrates a placement of an underfill material 1021 between the first package 1000 and the second package 1019. In an embodiment the underfill material 1021 is a protective material used to cushion and support the first package 1000 and the second package 1019 from operational and environmental degradation, such as stresses caused by the generation of heat during operation. The underfill material 1021 may be injected or otherwise formed in the space between the first package 1000 and the second package 1019 and may, for example, comprise a liquid epoxy that is dispensed between the first package 1000 and the second package 1019 and then cured to harden.

Figure 11:
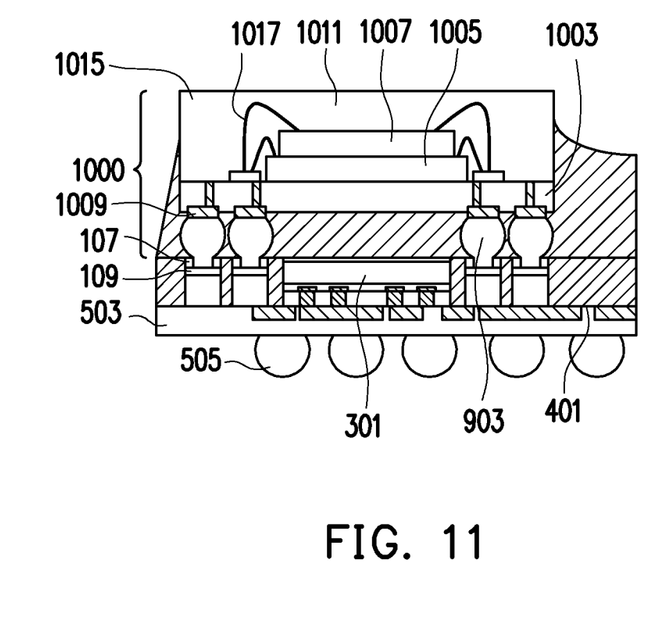
FIG. 11 illustrates a singulation process in accordance with some embodiments.

FIG. 11 illustrates a singulation of the first package 1000 from the second package 1019. In an embodiment the singulation may be performed by using a saw blade (not separately illustrated) to slice through the underfill material 1021 and the encapsulant 401. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the first package 1000 from the second package 1019.

By utilizing the first seed layer 107 and patterning it into a de-wetting structure as described above, the risk of delamination between the underfill material 1021 and the fourth external connections 903 may be reduced. As such, the risk of delamination or cracks between the fourth external connections 903 and the vias 113 may be reduced. Such improvements will increase the yield of the manufacturing process.

In an embodiment, a method of manufacturing a semiconductor device includes depositing a first lining layer over a substrate; depositing a first seed layer in physical contact with the first lining layer; plating a via onto the first seed layer; removing portions of the first lining layer and the first seed layer using the via as a mask; encapsulating the via along with a semiconductor die with an encapsulant; and after the encapsulating the via, patterning the first lining layer to expose an inner portion of the first seed layer without exposing an outer portion of the first seed layer. In an embodiment, the first lining layer comprises titanium. In an embodiment, the first seed layer comprises copper. In an embodiment, the method further includes forming a polymer layer over the via after the encapsulating the via. In an embodiment, the method further includes removing a portion of the polymer layer to expose the first lining layer. In an embodiment, the removing the portion of the polymer layer comprises directing a laser at the polymer layer. In an embodiment, the method further includes placing a conductive material in direct physical contact with both the first lining layer and the first seed layer.

In another embodiment, a method of manufacturing a semiconductor device includes placing an encapsulant over a polymer layer, the encapsulant encapsulating a semiconductor device and a plurality of vias, each of the plurality of vias laterally separate from the semiconductor device; patterning the polymer layer to expose a first lining layer of one of the plurality of vias; patterning the first lining layer into a ring structure, wherein the patterning the first lining layer is performed using the polymer layer as a mask and wherein the patterning the first lining layer exposes a portion of a first seed layer; and placing a conductive material in physical contact with the first seed layer through the first lining layer. In an embodiment, the first lining layer is titanium. In an embodiment, the first seed layer is copper. In an embodiment, the patterning the polymer layer comprises a laser drill. In an embodiment, the patterning the first lining layer comprises performing a dry etching process. In an embodiment, the method further includes removing the polymer layer after the patterning the first lining layer. In an embodiment, the ring structure has an inner diameter of between about 150 µm and about 200 µm.

In another embodiment, a semiconductor device includes an encapsulant encapsulating a semiconductor device; a first via extending from a first side of the encapsulant to a second side of the encapsulant, the first via comprising: a first lining layer; a first seed layer in physical contact with the first lining layer, the first seed layer being different from the first lining layer; and a conductive material in physical contact with the first seed layer on an opposite side of the first seed layer from the first lining layer, wherein the first lining layer is in a ring shape. In an embodiment, the ring shape has an inner diameter of greater than about 150 µm. In an embodiment, the ring shape has an outer diameter of less than about 200 µm. In an embodiment, the first lining layer comprises a de-wetting material. In an embodiment, the de-wetting material is titanium. In an embodiment, the titanium has a thickness of between 50 Å and 300 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing a first lining layer over a polymer layer over a substrate;
   depositing a first seed layer in physical contact with the first lining layer;
   plating a via onto the first seed layer;
   removing portions of the first lining layer and the first seed layer using the via as a mask;
   encapsulating the via along with a semiconductor die with an encapsulant;
   after the encapsulating the via, patterning the first lining layer to expose an inner portion of the first seed layer without exposing an outer portion of the first seed layer, wherein after the patterning the first lining layer each opening through the polymer layer is directly over a portion of the first seed layer; and
   removing the polymer layer after the patterning the first lining layer.

2. The method of claim 1, wherein the first lining layer comprises titanium.

3. The method of claim 2, wherein the first seed layer comprises copper.

4. The method of claim 1, further comprising forming a polymer layer over the via after the encapsulating the via.

5. The method of claim 4, further comprising removing a portion of the polymer layer to expose the first lining layer.

6. The method of claim 5, wherein the removing the portion of the polymer layer comprises directing a laser at the polymer layer.

7. The method of claim 1, further comprising placing a conductive material in direct physical contact with both the first lining layer and the first seed layer.

8. A method of manufacturing a semiconductor device, the method comprising:
   placing an encapsulant over a polymer layer, the encapsulant encapsulating a semiconductor device and a plurality of vias, each of the plurality of vias laterally separate from the semiconductor device;
   patterning the polymer layer to expose a first lining layer of one of the plurality of vias;
   patterning the first lining layer into a ring structure, wherein the patterning the first lining layer is performed using the polymer layer as a mask and wherein the patterning the first lining layer exposes a portion of a first seed layer;
   removing the polymer layer after the patterning the first lining layer; and
   placing a conductive material in physical contact with the first seed layer through the first lining layer.

9. The method of claim 8, wherein the first lining layer is titanium.

10. The method of claim 9, wherein the first seed layer is copper.

11. The method of claim 8, wherein the patterning the polymer layer comprises a laser drill.

12. The method of claim 11, wherein the patterning the first lining layer comprises performing a dry etching process.

13. The method of claim 8, wherein the ring structure has an inner diameter of between about 150 µm and about 200 µm.

14. A method of manufacturing a semiconductor device, the method comprising:
   encapsulating a semiconductor device and a first via with an encapsulant, wherein after the encapsulating the first via extends from a first side of the encapsulant to a second side of the encapsulant, the first via comprising:
      a first lining layer;
      a first seed layer in physical contact with the first lining layer, the first seed layer being different from the first lining layer; and
      a conductive material in physical contact with the first seed layer on an opposite side of the first seed layer from the first lining layer, wherein the first lining layer is in a ring shape; and
   removing a polymer material after the patterning the first lining layer from adjacent to the first lining layer.

15. The method of claim 14, wherein the ring shape has an inner diameter of greater than about 150 µm.

16. The method of claim 14, wherein the ring shape has an outer diameter of less than about 200 µm.

17. The method of claim 14, wherein the first lining layer comprises a de-wetting material.

18. The method of claim 17, wherein the de-wetting material is titanium.

19. The method of claim 18, wherein the titanium has a thickness of between 50 Å and 300 Å.

20. The method of claim 1, wherein after the patterning the first lining layer the first lining layer has an inner diameter of between about 150 μm and about 200 μm.

* * * * *